United States Patent
Lee et al.

(10) Patent No.: US 9,252,051 B1
(45) Date of Patent: Feb. 2, 2016

(54) METHOD FOR TOP OXIDE ROUNDING WITH PROTECTION OF PATTERNED FEATURES

(71) Applicants: International Business Machines Corporation, Armonk, NY (US); STMicroelectronics, Inc., Coppell, TX (US)

(72) Inventors: Joe Lee, Albany, NY (US); Yann Mignot, Slingerlands, NY (US); Douglas M. Trickett, Altamont, NY (US)

(73) Assignees: INTERNATIONAL BUSINESS MACHINES CORPORATION, Armonk, NY (US); STMICROELECTRONICS, INC., Coppell, TX (US)

( * ) Notice: Subject to any disclaimer, the term of this patent is extended or adjusted under 35 U.S.C. 154(b) by 0 days.

(21) Appl. No.: 14/540,367

(22) Filed: Nov. 13, 2014

(51) Int. Cl.
*H01L 21/302* (2006.01)
*H01L 21/768* (2006.01)

(52) U.S. Cl.
CPC .... *H01L 21/76877* (2013.01); *H01L 21/76807* (2013.01); *H01L 21/76819* (2013.01)

(58) Field of Classification Search
CPC .............. H01L 21/76232; H01L 21/31116; H01L 2924/00; H01L 21/3065; H01L 21/76804; H01L 29/66545; H01L 21/31138; H01L 21/31144; H01L 27/10873; H01L 27/11521; H01L 2924/0002; H01L 29/1037; H01L 29/666
USPC .......... 438/270, 595, 770, 435, 771; 257/410, 257/E21.301, E29.028
See application file for complete search history.

(56) References Cited

U.S. PATENT DOCUMENTS

| | | | |
|---|---|---|---|
| 8,535,551 | B2 | 9/2013 | Suzuki et al. |
| 8,551,877 | B2 | 10/2013 | Ranjan et al. |
| 2005/0247670 | A1 | 11/2005 | Yamada et al. |
| 2006/0051968 | A1 | 3/2006 | Joshi et al. |
| 2006/0115981 | A1 | 6/2006 | Shieh et al. |
| 2013/0105947 | A1 | 5/2013 | Fuller et al. |
| 2014/0065784 | A1 | 3/2014 | Yoon et al. |

*Primary Examiner* — Mark A Laurenzi
(74) *Attorney, Agent, or Firm* — Scully, Scott, Murphy & Presser, P.C.; Steven J. Meyers, Esq.

(57) ABSTRACT

After completely etching through a material stack comprising an oxide hard mask layer and an underlying interlevel dielectric (ILD) layer formed on a substrate to provide at least one opening, top corners of the at least one opening are rounded by performing a plasma etch employing a combination of an etching gas and a deposition gas comprising a hydrofluorocarbon compound. The hydrofluorocarbon compound forms a hydrofluorocarbon polymer layer on sidewalls of the at least one opening and helps to preserve the profile of the at least one opening.

20 Claims, 4 Drawing Sheets

METHOD FOR TOP OXIDE ROUNDING WITH PROTECTION OF PATTERNED FEATURES

BACKGROUND

The present application relates to the formation of back-end-of-line (BEOL) interconnect structures in integrated circuits and, more particularly to a method that provides enhanced protection to patterned features during a top oxide rounding process in the formation of the interconnect structures.

Back-end-of-line (BEOL) interconnect structures are used to electrically connect the device structures fabricated on the substrate during front-end-of-line (FEOL) processing. BEOL interconnect structures are routinely fabricated by damascene processes, such as a dual damascene process in which vias and trenches formed in a dielectric layer are filled with a conductive material using a single blanket deposition followed by planarization.

Trenches formed in the dielectric layer using conventional etching/hard mask removal processes typically have sharp, squared-off top corners which cause the formation of defects, such as voids, within the trenches when filling the trenches with the conductive material. One method to mitigate this filling problem is to round the top corners of the trenches using a fluorocarbon-based plasma etch to allow a more uniform deposition of the conductive material. However, top corner rounding (TCR) with conventional fluorocarbon-based plasma etch chemistries normally results in undesirable effects, such as increased via critical dimension (CD) and trench over-etching, making it difficult to maintain trench and via profiles. As such, a method that allows a better preservation of patterned feature profile during a TCR process is needed.

SUMMARY

The present application provides a method that allows a better preservation of a patterned feature profile during a TCR process. This can be achieved by rounding top corner patterned features (i.e., trenches) by performing a plasma etch using a chemistry based on an etching gas and a deposition gas comprising a hydrofluorocarbon compound. Plasma generated from the etching gas and the highly polymerizable hydrofluorocarbon compound can be tuned to obtain minimal profile change to patterned features while achieving adequate feature rounding.

In one aspect of the present application, a method of forming a semiconductor structure is provided. The method includes first forming at least one opening through a material stack comprising an interlevel dielectric (ILD) layer formed over a substrate and an oxide hard mask layer formed over the ILD layer. After rounding top corners of the at least one opening by performing a plasma etch employing a combination of an etching gas and a deposition gas comprising a hydrofluorocarbon compound, the at least one opening is filled with a conductive material.

DETAILED DESCRIPTION

Figure 1:
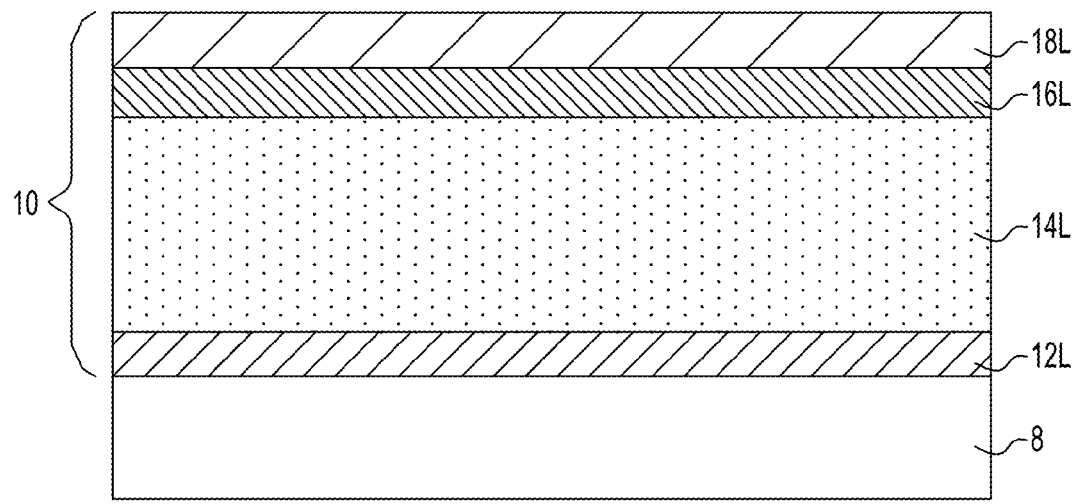
FIG. 1 is a cross-sectional view of an exemplary semiconductor structure including a substrate and a material stack formed thereon in accordance with an embodiment of present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure comprising a material stack 10 formed on a substrate 8 in accordance with an embodiment of the present application. The material stack 10 comprises, for bottom to top, a cap layer 12L, a interlevel dielectric (ILD) layer 14L, an oxide hard mask layer 16L and a metal hard mask layer 18L.

The substrate 8 can be a semiconductor substrate having at least one semiconductor device thereupon and/or therein, or can be a stack of a semiconductor substrate and at least one underlying metal interconnect structure that includes at least one conductive via, at least one conductive line, or a combination thereof within at least one underlying dielectric material layer.

The cap layer 12L that is formed on the substrate 8 may include a dielectric material such as, for example, silicon oxide, silicon nitride or silicon carbide. The cap layer 12L may be formed by utilizing a conventional deposition process such as, for example, chemical vapor deposition (CVD), plasma enhanced chemical vapor deposition (PECVD), or spin coating. The thickness of the cap layer 12L can be from 5 nm to 20 nm, although lesser and greater thicknesses can also be employed. In some embodiments of the present application, the cap layer 12L is optional and can be omitted.

The ILD layer 14L that is formed on the cap layer 12L (or the substrate 8, if the cap layer 12L is omitted) may comprise any suitable dielectric material. In one embodiment, the ILD layer 14L includes an ultra-low-k (ULK) dielectric material, i.e., a dielectric material having a dielectric constant lower than 3.0, to reduce the parasitic capacitance between adjacent metal interconnect structures to be subsequently formed in the ILD layer 14L. Exemplary materials that can be used in the ILD layer 14L include, but are not limited to, a carbon-doped silicon oxide, a fluorine-doped silicon oxide, a hydrogen-enriched silicon oxycarbide (SiCOH), a porous silicon oxide, a porous carbon-doped silicon oxide, a porous SiLK™, a spin-on silicone based polymeric dielectric such as methyl silsesquioxane (MSQ) and hydrogen silsesquioxane (HSQ), or a spin-on organic polymeric dielectric.

The ILD layer 14L may be formed by CVD, PECVD or spin coating. The thickness of the ILD layer 14L may be from about 30 nm to about 1,000 nm, although lesser and greater thicknesses can also be employed.

The oxide hard mask layer 16L that is formed on the ILD layer 14L may include silicon oxide or aluminum oxide. In one embodiment, the oxide hard mask layer 16L includes silicon oxide deposited by a CVD or PECVD process that employs tetraethylorthosilicate (TEOS) and oxygen as precursors. The thickness of the oxide hard mask layer 16L can be from 5 to 20 nm, although lesser and greater thicknesses can also be employed.

The metal hard mask layer 18L that is formed on the oxide hard mask layer 16L may include titanium nitride or tantalum nitride. The metal hard mask layer 18L can be formed using CVD or physical vapor deposition (PVD). The thickness of the metal hard mask layer 18L can be from 10 to 100 nm, although lesser and greater thicknesses can also be employed.

Figure 2:
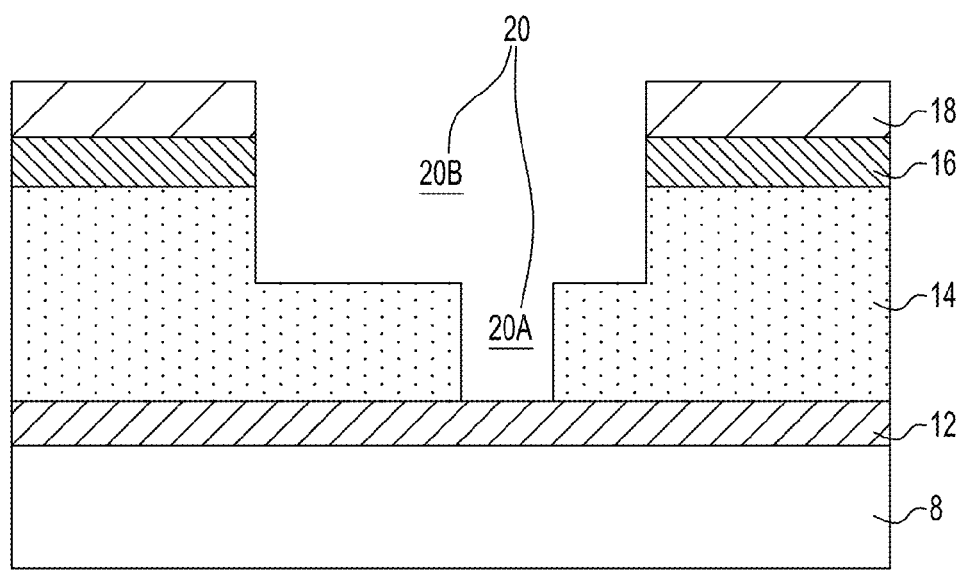
FIG. 2 is a cross-sectional view of the exemplary semiconductor structure of FIG. 1 after forming at least one opening in the material stack.

Referring now to FIG. 2, there is illustrated the exemplary semiconductor structure after forming at least one opening 20 in the material stack 10. In one embodiment and as shown in FIG. 2, the opening 20 has a dual damascene structure containing a via opening 20A located beneath a trench (i.e., a line) opening 20B to expose a top surface of the substrate 8. Although the opening 20 is illustrated as a dual damascene structure, embodiments in which a single damascene structure is formed either at the trench level or at the via level can also be contemplated.

The opening 20 can also be formed by any suitably lithographic patterning and etching techniques such as, for example, litho-etch-litho-etch (LELE), sidewall imaging transfer (SIT) or self-aligned via double-patterning (SAVDP).

In one embodiment as shown in FIG. 2, the opening 20 is formed by the conventional LELE process. Firstly, a first photoresist layer (not shown) is applied over the metal hard mask layer 18L and lithographically patterned to form a first pattern including at least one first opening therein. The first pattern can be a pattern for trench openings 20B to be subsequently formed within the ILD layer 14L. The first pattern is transferred into the metal hard mask layer 18L by at least one anisotropic etch selective to the oxide hard mask layer 16. The remaining portion of the metal hard mask layer 18L constitutes a patterned metal hard mask layer 18. The pattern transfer can be effected, for example, by a dry etch such as an reactive ion etch (RIE) or by a wet chemical etch employing dilute hydrofluoric acid. The remaining portion of the first photoresist layer can be subsequently removed, for example, by ashing.

Next, a lithographic stack including a second photoresist layer is formed over the patterned metal hard mask layer 18 and exposed surface of the oxide hard mask layer 16L (not shown). In one embodiment, the lithographic stack may include, from bottom to top, an organic planarization layer (OPL), an optional antireflective coating (ARC) layer, and the second photoresist layer, with the OPL completely fills the first opening in the patterned hard mask layer 18. The OPL may include an organic self-planarizing material such as, for example, a polymer with low viscosity. The thickness of the OPL, as measured from above the top surface of the patterned metal hard mask layer 18, can be from 30 nm to 300 nm, although lesser and greater thicknesses can also be employed. The optional ARC layer can include any antireflective coating material known in the art, and can have a thickness from 10 nm to 200 nm, although lesser and greater thicknesses can also be employed.

After forming the lithographic stack, the second photoresist layer is lithographically patterned to form a second pattern including at least one second opening therein. The second pattern can be a pattern for via openings 20A to be subsequently formed within the ILD layer 14L. In one embodiment, the area of the first opening and the area of the second opening can overlap with each other. The second pattern is then transferred into the optical ARC layer and the OPL. The remaining portion of the lithographic stack constitutes a patterned lithographic stack.

The oxide hard mask layer 16L, the ILD layer 14L and the cap layer 12L can be etched employing a combination of the patterned lithographic stack and the patterned metal hard mask layer 18 to form the opening 20 embedded within the ILD layer 14L. Specifically, the oxide hard mask layer 16L, the ILD layer 14L and the cap layer 12L are etched using the patterned lithographic stack as an etch mask to form the via opening 20A. The etch of the oxide hard mask layer 16L, the ILD layer 14L and the cap layer 12L can be effected by at least one anisotropic etch such as RIE. If not consumed during the at least one anisotropic etch that transfers the second pattern into the oxide hard mask layer 16L, the ILD layer 14L and the cap layer 12L, the patterned lithographic stack may be removed by ashing. After forming the via opening 20A, another anisotropic etch is performed to form the trench opening 20B in an upper portion of the ILD layer 14L using the patterned metal hard mask layer 18 as an etch mask. The via opening 20A and the trench opening 20B are connected to each other, and collectively form a dual damascene opening 20. The patterned metal hard mask layer 18 may be thinned during the pattern transfer process. The remaining portion of the oxide hard mask layer 16L constitutes a patterned oxide hard mask layer 16. The remaining portion of the ILD layer 14L constitutes a patterned ILD layer 14. The remaining portion of the cap layer 12L constitutes a patterned cap layer 12.

Figure 3:
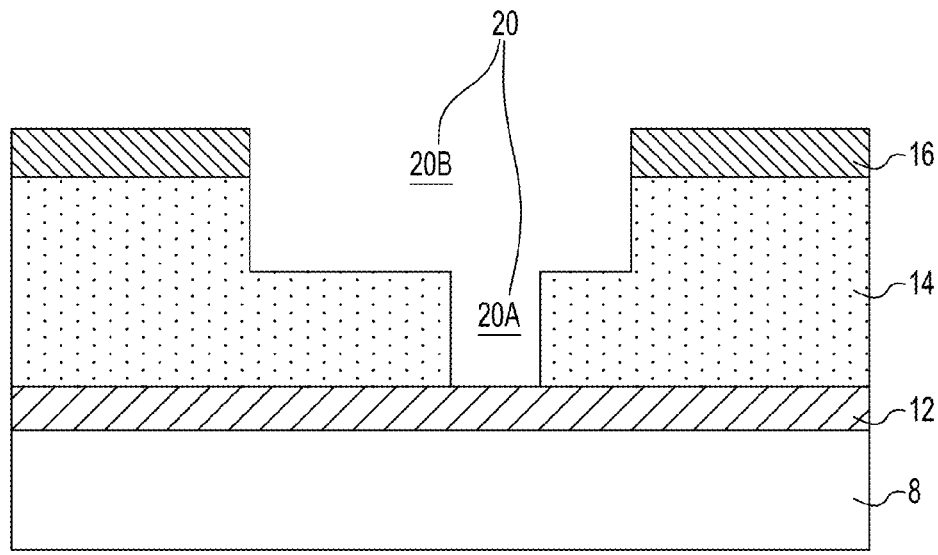
FIG. 3 is a cross-sectional view of the exemplary semiconductor structure of FIG. 2 after removing a patterned metal hard mask layer from the patterned material stack.

Referring now to FIG. 3, there is illustrated the exemplary semiconductor structure after removing the patterned metal hard mask layer 18. The removal of the patterned metal hard mask layer 18 can be selective to dielectric materials of the oxide hard mask layer 16L, the ILD layer 14L and the cap layer 12L. The selective removal of the patterned metal hard mask layer 18 can be effected, for example, by a wet chemical etch using an alkaline solution (SC-1) including an aqueous mixture of ammonium hydroxide and hydrogen peroxide (e.g., 1:1:5 of 30% $H_2O_2$, 28% $NH_4OH$ and $H_2O$).

Figure 4:
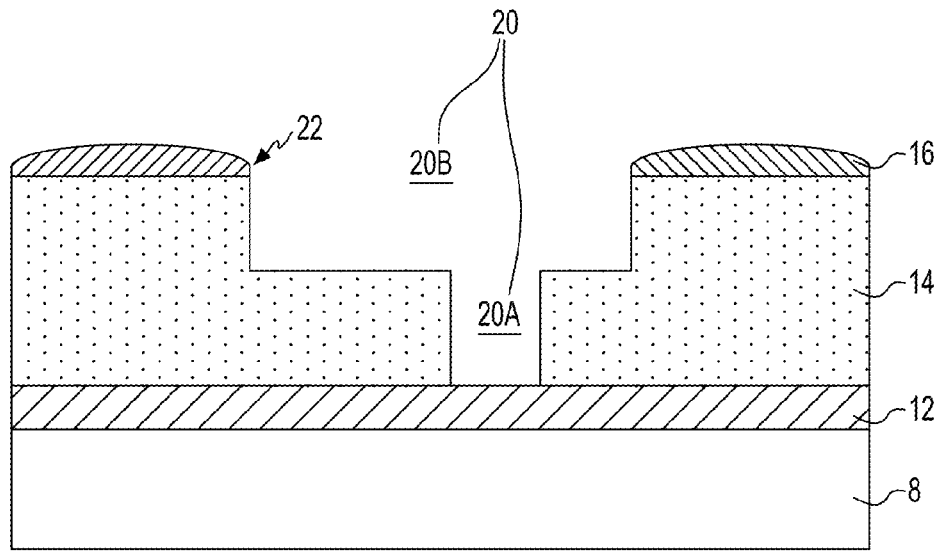
FIG. 4 is a cross-sectional view of the exemplary semiconductor structure of FIG. 3 after rounding top corners of the opening.

Referring now to FIG. 4, there is illustrated the exemplary semiconductor structure after rounding top corners of the opening 20 (i.e., top portions of the patterned oxide hard mask layer 16). In one embodiment, the TCR of the opening 20 may be accomplished by a plasma etch employing an etching gas and a deposition gas comprising a hydrofluorocarbon compound. The plasma etch can be performed in an etch chamber configured to generate a plasma therein. The etch chamber can be, for example, a reactive ion etch chamber configured to generate a plasma by coupling radio frequency (RF) electromagnetic field to a gas therein.

After placing the exemplary semiconductor structure of FIG. 3 in the etch chamber, an etching gas containing a fluorine containing compound and a deposition gas containing a hydrofluorocarbon compound are provided into the etch chamber. The deposition gas may be premixed with the etching gas before being introduced into the etch chamber. Alternatively, the etching gas and the deposition gas may be introduced from separate gas inlets into the etch chamber where the plasma is generated. A carrier gas and/or diluent gas may be introduced to the etch chamber to control the rate of the plasma etching and deposition. Exemplary carrier gases and/or dilute gases include, but are not limited to, argon, helium, hydrogen, nitrogen, carbon monoxide or mixtures thereof.

The etching gas is provided to round corners of the patterned oxide hard mask layer 16. Exemplary fluorine (F) containing compounds that can be employed as the etching gas include, but are not limited to, $SF_6$, $SiF_4$, $NF_3$, and a fluorocarbon compound, such as, $CF_4$, or $C_2F_6$.

The deposition gas is provided to form a hydrofluorocarbon polymer on sidewalls of the opening 20 to prevent etching of sidewalls and horizontal surfaces of the opening 20 during the TCR rounding process so that the profile of the opening 20 can be better preserved. The hydrofluorocarbon compounds that can be employed as the deposition gas may have a chemical formula of $C_xH_yF_z$, wherein x is an integer selected from 3, 4, 5, 6, and 7, each of y and z is a positive integer not greater than 15. In one embodiment, the hydrofluorocarbon compound is 1,3,3,4,4,5,5-heptafluorocyclopentene ($C_5HF_7$).

A plasma is generated from the etching gas and the deposition gas in the etch chamber. A bias voltage is provided to facilitate the etching of the dielectric material of the patterned oxide hard mask layer 16. At the same time, a hydrofluorocarbon polymer layer is deposited on sidewalls and horizontal surfaces of the opening 20. The etching rate and the deposition rate are controlled such that the etching gas etches the hydrofluorocarbon polymer layer rather than the patterned ILD layer 14, thus preventing the etching of the sidewalls and horizontal surfaces of the opening 20. Furthermore, the etching gas strips away the hydrofluorocarbon polymer as it builds up, thus preventing the continuous buildup of the hydrofluorocarbon polymer layer on the sidewalls and horizontal surfaces of the opening 20.

The pressure of the plasma of the etching gas ions and the deposition gas ions can be from 1 mTorr to 100 mTorr, although lesser and greater pressures can also be employed. The etch rate of the semiconductor material during the etch process can be from 10 nm per minute to 200 nm per minute, although lesser and greater etch rates can also be achieved. The temperature of the TCR process can be from −30° C. to 60° C., although lesser and greater temperatures can also be employed. The time duration of the TCR process can be from 5 second to 30 seconds, although lesser and greater time durations can also be employed.

This plasma etch process continues until the top corners of the opening 20 (i.e., upper portions of the patterned oxide hard mask layer 16) are rounded, thus forming curved or rounded top edges 22, as illustrated in FIG. 4. At the end of the TCR process, any hydrofluorocarbon polymer that remains on sidewalls and horizontal surfaces of the opening 20 is removed by typical wet cleaning processes.

Figure 5A:
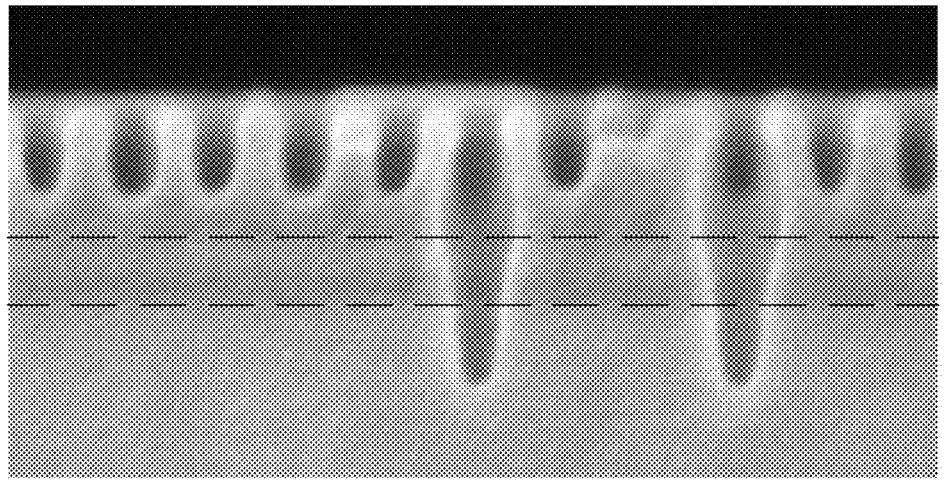
FIG. 5(a) is a SEM image showing an etching profile obtained using a new TCR process with a mixture of $NF_3/CF_4$ as the etching gas and $C_5HF_7$ as the deposition gas.
Figure 5B:
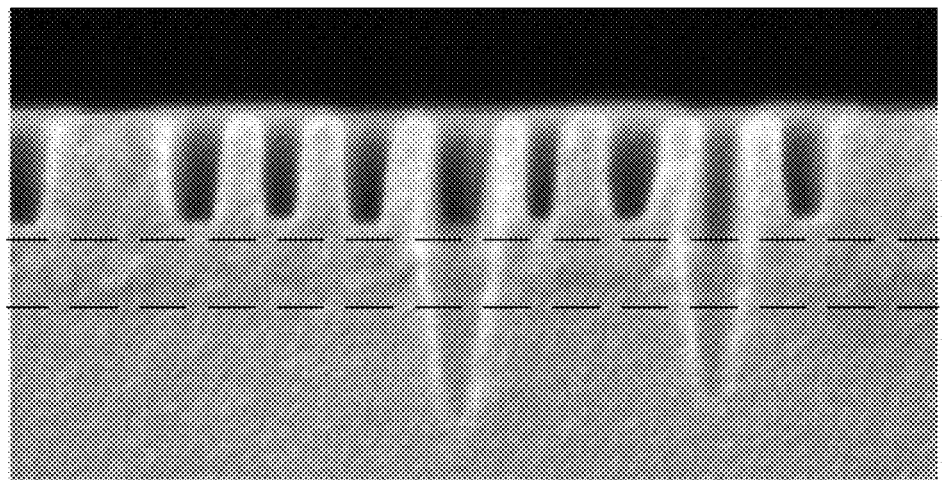
FIG. 5(b) is a SEM image showing an etching profile obtained using a conventional TCR process with a mixture of $NF_3/CF_4$ as the etching gas and $C_4F_8$ as the deposition gas.

FIG. 5(a) is a SEM image showing patterned feature profiles obtained using the TCR process of the present application in which a mixture of $NF_3/CF_4$ is employed as the etching gas and $C_5HF_7$ is employed as the deposition gas. The processing time for the TCR process of the present application is approximately 20 seconds. FIG. 5(b) is a SEM image showing patterned feature profiles obtained using a conventional TCR process with a mixture of $NF_3/CF_4$ as the etching gas and $C_4F_8$ as the deposition gas. The processing time for the conventional TCR process can be from 5 seconds to 10 seconds, which is shorter than that of the present application to avoid the excessive loss of the ILD layer. Both TCR methods are performed on openings with a dual damascene structure. The openings are formed in a material stack comprising a TEOS hard mask layer and an underlying ILD layer composed of a ULK dielectric material. The dielectric constant of the ILD layer typically is less than 2.7.

As shown in FIGS. 5A and 5B, when approximately the same amounts of oxide are removed from the upper portions of the patterned oxide hard mask layer to obtain desirable TCR effect, the $C_5HF_7$-based plasma chemistry etches exposed surfaces of the patterned ILD layer a lot less than the $C_4H_8$-based plasma chemistry. The $C_5HF_7$-based plasma chemistry can reduce trench over-etch up to 80% and reduce the enlargement of the via lateral dimension up to 80% comparing to the $C_4F_8$-based plasma chemistry. This indicates that the polymer derived from the hydrofluorocarbon compound, $C_5HF_7$, can provide a better protection to the ILD layer than the polymer derived from the conventional fluorocarbon compound, $C_4F_8$. As a result, the opening profiles are preserved after the TCR process with $C_5HF_7$ as the deposition gas.

The TCR process employing a deposition gas comprising a hydrofluorocarbon compound thus has shown to have significant advantages over the TCR process employing a deposition gas comprising a conventional fluorocarbon compound that does not include hydrogen in term of feature profile preservation. Comparing to the fluorocarbon plasmas chemistry, the hydrofluorocarbon plasma chemistry provides a better protection to ULK dielectric material exposed in the openings, thus openings with straighter sidewalls, smaller via CD and less over-etch can be obtained. This may allow a tight control of patterned features at smaller dimensions. The better preservation of the opening profiles may be attributed to the higher polymerization characteristics of the hydrofluorocarbon compound. Moreover, the longer processing time with the hydrofluorocarbon plasma chemistry also allows for a larger process window.

Figure 6:
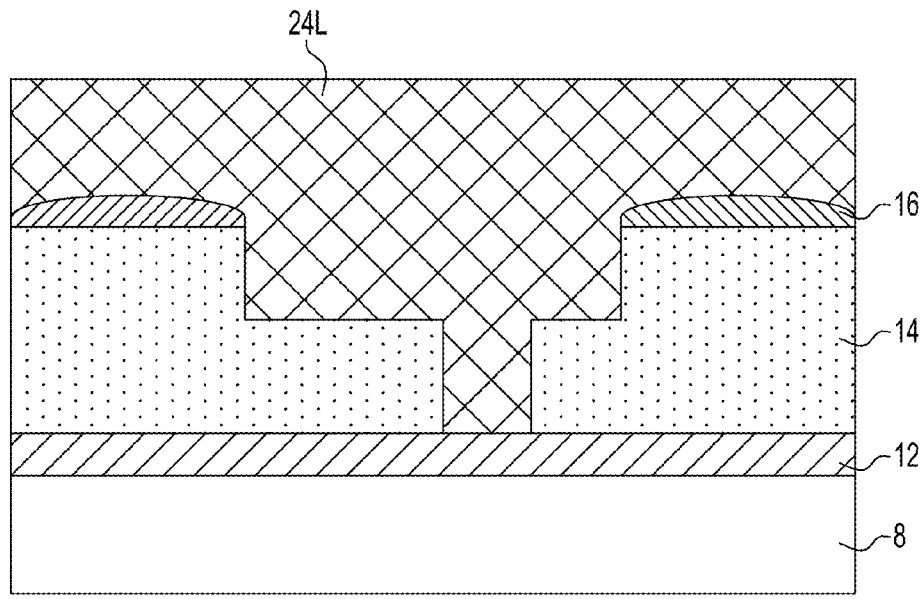
FIG. 6 is a cross-sectional view of the exemplary semiconductor structure of FIG. 4 after forming a conductive material layer to fill the opening.

Referring now to FIG. 6, there is illustrated the exemplary semiconductor structure after forming a conductive material layer 24L to fill the opening 20. The conductive material layer 24L may include a metal such as, for example, Cu, Al, W, Ti, Ta or their alloys. The conductive material layer 24L can be formed by a conventional deposition process such as, for example, CVD, physical vapor deposition (PVD), atomic layer deposition (ALD), or plating. The conductive material layer 24L is deposited to a thickness so that a topmost surface of the conductive material layer 24L is located above the topmost surface of the patterned oxide hard mask layer 16.

Figure 7:
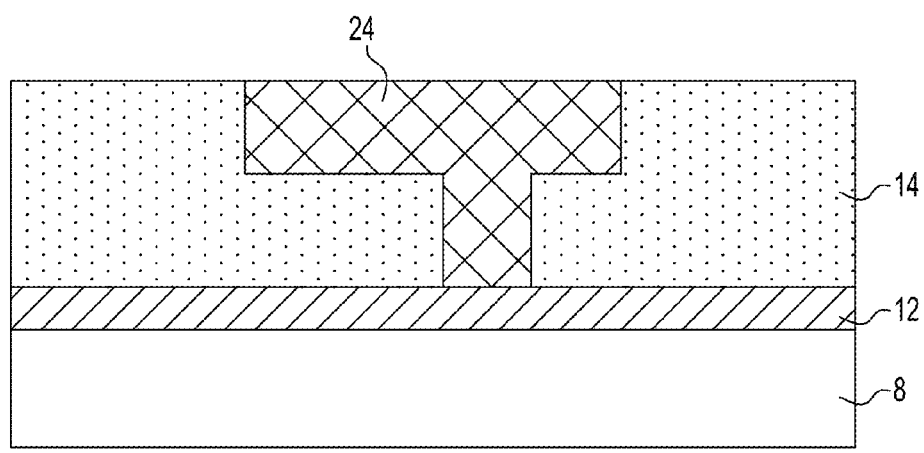
FIG. 7 is a cross-sectional view of the exemplary semiconductor structure of FIG. 6 after planarizing the conductive material layer to form an interconnect structure in the opening.

Referring now to FIG. 7, there is illustrated the exemplary semiconductor structure after forming an interconnected structure 24 in the opening 20. Portions of the conductive material layer 24L and the patterned oxide hard mask layer 16 that are located above the topmost surfaces of the patterned ILD layer 14 may be removed, for example, by chemical mechanical polishing (CMP), recess etch, or a combination thereof. The remaining portion of the conductive material layer 24L constitutes the interconnect structure 24.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
    forming at least one opening through a material stack comprising an interlevel dielectric (ILD) layer formed over a substrate and an oxide hard mask layer formed over the ILD layer;
    rounding top corners of the at least one opening by performing a plasma etch employing a combination of an etching gas and a deposition gas comprising a hydrofluorocarbon compound; and
    filling the at least one opening with a conductive material.

2. The method of claim 1, wherein the hydrofluorocarbon compound is represented by a chemical formula of $C_x H_y F_z$, wherein x is an integer selected from 3, 4, 5, 6, and 7, and each of y and z is a positive integer not greater than 15.

3. The method of claim 2, wherein the hydrofluorocarbon compound is $C_5HF_7$.

4. The method of claim 1, wherein the etching gas comprises $SF_6$, $SiF_4$, $NF_3$, a fluorocarbon compound, or a combination thereof.

5. The method of claim 1, wherein the ILD layer comprises an ultra-low-k (ULK) dielectric material.

6. The method of claim 5, wherein the ULK dielectric material comprises a carbon-doped silicon oxide, a fluorine-doped silicon oxide, a hydrogen-enriched silicon oxycarbide (SiCOH), a porous silicon oxide, a porous carbon-doped silicon oxide, a porous SiLK™, a spin-on silicone based polymeric dielectric, or a spin-on organic polymeric dielectric.

7. The method of claim 1, wherein the oxide hard mask layer is made of tetraethylorthosilicate (TEOS).

8. The method of claim 1, wherein the at least one opening has a dual damascene structure containing a via opening located beneath a trench opening, the at least one opening exposing a top surface of the substrate.

9. The method of claim 1, wherein the substrate is a semiconductor substrate comprising at least one semiconductor device thereupon and/or therein.

10. The method of claim 1, wherein the substrate is a stack of a semiconductor substrate and at least one underlying metal interconnect structure that includes at least one conductive via, at least one conductive line, or a combination thereof.

11. The method of claim 1, wherein the conductive material comprises copper or tungsten.

12. The method of claim 1, further comprising planarizing deposited conductive material after the filling the at least one opening with the conductive material.

13. The method of claim 1, wherein the material stack further comprises a capping layer formed between the ILD layer and the substrate, and a metal hard mask layer formed over the oxide hard mask layer.

14. The method of claim 13, wherein the forming at least one opening through the material stack comprises:
    applying a photoresist layer over a topmost surface of the material stack;
    patterning the photoresist layer to provide a first pattern containing at least one trench opening, wherein the at least one trench opening exposes a portion of a top surface of the metal hard mask layer; and
    transferring the first pattern into the meal hard mask layer by an anisotropic etch.

15. The method of claim 14, further comprising removing a remaining portion of the photoresist layer after the transferring the first pattern into the metal hard mask layer.

16. The method of claim 15, further comprising:
    forming a lithographic stack over a remaining portion of the metal hard mask layer and an exposed portion of the oxide hard mask layer;
    patterning the lithographic stack to provide a second pattern containing at least one via opening, wherein the at least one via opening exposes a portion of a top surface of the oxide hard mask layer.

17. The method of claim 16, further comprising:
    forming the at least one opening in the material stack using a combination of the remaining portion of the metal hard mask layer and a remaining portion of the lithographic stack as an etch mask.

18. The method of claim 17, further comprising removing the remaining portion of the lithographic stack after the forming the at least one opening in the material stack.

19. The method of claim 18, further comprising removing the remaining portion of the metal hard mask layer by a wet chemical etch after removing the remaining portion of the lithographic stack.

20. The method of claim 1, wherein upper portions of a remaining portion of the oxide hard mask layer are rounded during the plasma etch performed to round the top corners of the at least one opening.

* * * * *